(12) United States Patent
Ariga

(10) Patent No.: US 7,532,470 B2
(45) Date of Patent: May 12, 2009

(54) ELECTRONIC APPARATUS

(75) Inventor: Koji Ariga, Oume (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 44 days.

(21) Appl. No.: 11/583,414

(22) Filed: Oct. 18, 2006

(65) Prior Publication Data

US 2007/0121292 A1 May 31, 2007

(30) Foreign Application Priority Data

Nov. 30, 2005 (JP) ............................ 2005-345906

(51) Int. Cl.
*H05K 7/20* (2006.01)
(52) U.S. Cl. .................. 361/695; 361/694; 454/184
(58) Field of Classification Search ............. 361/687, 361/694–695; 454/184
See application file for complete search history.

(56) References Cited

U.S. PATENT DOCUMENTS

| | | | | |
|---|---|---|---|---|
| 6,028,009 | A * | 2/2000 | Igel et al. ................ | 438/739 |
| 6,188,573 | B1 * | 2/2001 | Urita .......................... | 361/687 |
| 6,210,134 | B1 | 4/2001 | Miyahara | |
| 6,312,989 | B1 * | 11/2001 | Hsieh et al. ............... | 438/257 |
| 6,406,257 | B1 * | 6/2002 | Houdek ................ | 415/213.1 |
| 6,504,716 | B2 * | 1/2003 | Huang et al. ............. | 361/695 |
| 6,616,525 | B1 * | 9/2003 | Giraldo et al. ............ | 454/184 |
| 6,646,877 | B2 * | 11/2003 | Willers et al. ............ | 361/695 |
| 7,121,637 | B2 * | 10/2006 | Fang ........................ | 312/223.2 |
| 2004/0212960 | A1 * | 10/2004 | Shih ........................... | 361/695 |

FOREIGN PATENT DOCUMENTS

| | | |
|---|---|---|
| CN | 2300943 | 12/1998 |
| JP | 10-051170 | 2/1998 |
| JP | 10-228335 | 8/1998 |
| JP | 11-214877 | 8/1999 |

OTHER PUBLICATIONS

Chinese Office Action dated Oct. 17, 2008 for application No. 2006-101628827 (U.S. Appl. No. 11/583,414), entitled Electronic Apparatus (English Translation).

* cited by examiner

*Primary Examiner*—Gregory D Thompson
(74) *Attorney, Agent, or Firm*—Blakely, Sokoloff, Taylor & Zafman LLP

(57) ABSTRACT

According to one embodiment, there is provided an electronic apparatus including: a substrate on which an electronic component is mounted; a casing that accommodates the substrate and has a recess portion; an air vent through which the recess portion is communicated with an inside of the casing; a hood that covers the recess portion and includes an exhaust port; a fan that is configured to suction air from the inside of the casing through the air vent to the recess portion and discharge the air to outside through the exhaust port, the fan being housed between the recess portion and the hood; and a motor that is supplied with power from the substrate to rotate the fan, the motor being housed between the recess portion and the hood.

14 Claims, 9 Drawing Sheets

ELECTRONIC APPARATUS

CROSS-REFERENCE TO RELATED APPLICATIONS

This application is based upon and claims the benefit of priority from Japanese Patent Application No. 2005-345906, filed Nov. 30, 2005 the entire contents of which are incorporated herein by reference.

BACKGROUND

1. Field

One embodiment of the invention relates to an electronic apparatus equipped with a fan for ventilating air in a casing accommodating an electronic component that generates heat.

2. Description of the Related Art

In order to cool a component that generates heat during operation, such as a semiconductor device or apparatus housed in a casing, a cooler or a heat radiator is accommodated. The cooler or heat radiator includes a heatsink that directly contacts a heat-generating electronic component to thus cool the electronic component by air or water; a fan that replaces the air contained in the casing with external air; and the like. These devices are embodied in the form of units separately from the casing.

Japanese Patent Application Publication (KOKAI) No. 10-51170 describes a cooler having a heat pipe, a fan, and a duct. A heat-receiving end of the heat pipe is joined to a radiator plate that is thermally connected to a heat-generating component such as a semiconductor by a support. The fan is placed on a heat radiator spaced apart from the heat-generating component, and is covered with a heat-transfer duct. The heat-transfer duct is fastened to the radiator plate by a fastener. In short, the fan is enclosed by the radiator plate and the heat-transfer duct.

A heat-radiating end of the heat pipe extends up to the heat-transfer duct. The heat from the heat-generating component, which has transmit through the radiator plate, the heat pipe, and the heat-transfer duct, is discharged to the outside by the fan together with low-temperature air. This cooler is placed in a casing, such as a notebook personal computer, while being assembled in the form of a unit.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, there is provided an electronic apparatus including: a substrate on which an electronic component is mounted; a casing that accommodates the substrate and has a recess portion; an air vent through which the recess portion is communicated with an inside of the casing; a hood that covers the recess portion and includes an exhaust port; a fan that is configured to suction air from the inside of the casing through the air vent to the recess portion and discharge the air to outside through the exhaust port, the fan being housed between the recess portion and the hood; and a motor that is supplied with power from the substrate to rotate the fan, the motor being housed between the recess portion and the hood.

Figure 1:
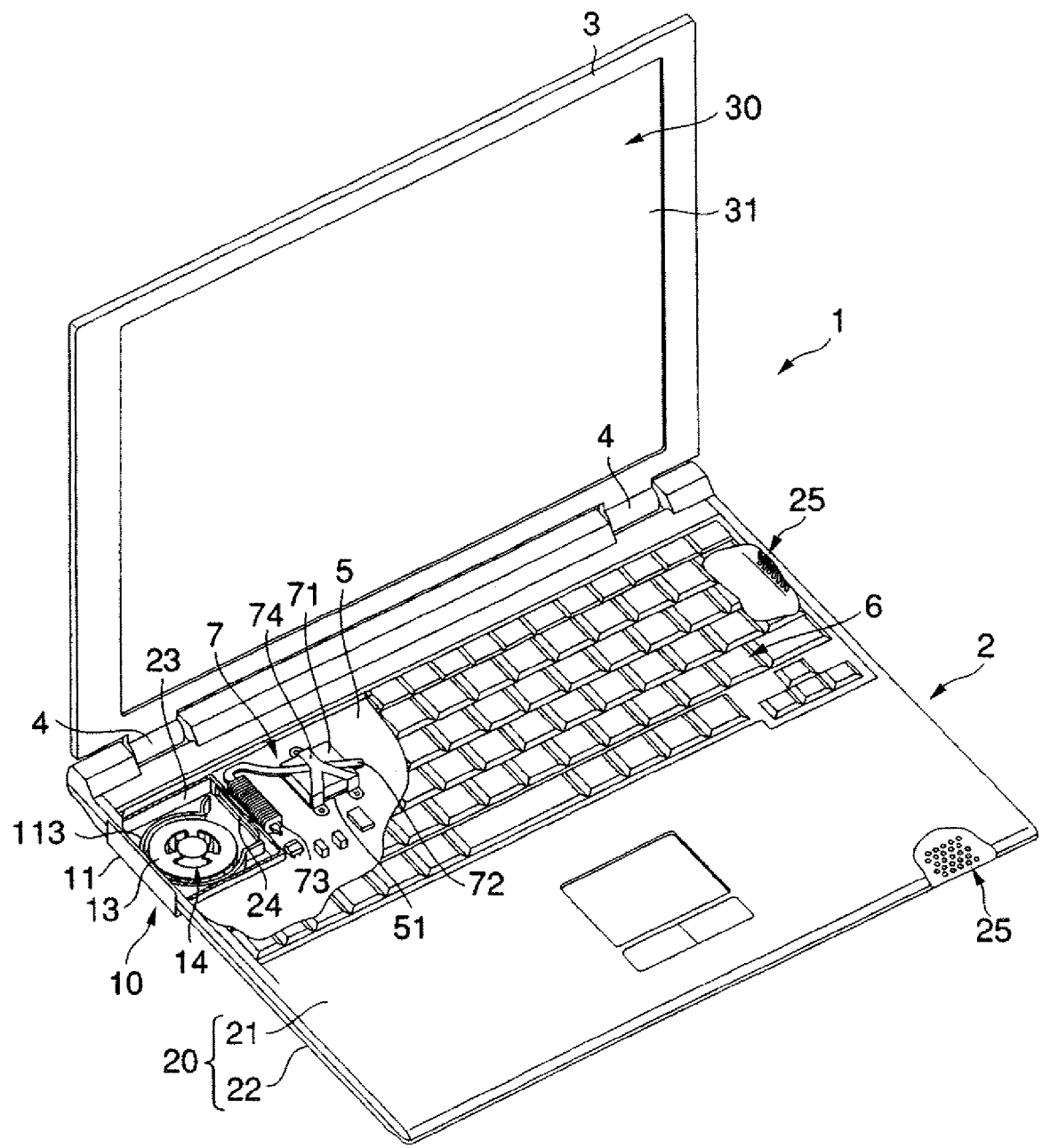
FIG. 1 is an exemplary perspective view showing an electronic apparatus according to a first embodiment of the present invention.

With reference to FIGS. 1 through 4, an electronic apparatus 1 according to a first embodiment of the present invention will be described. The electronic apparatus 1 shown in FIG. 1 is a notebook portable computer. The electronic apparatus 1 has a main body 2 and a display panel 3. The main body 2 is joined, at a rear section distant from the user, to the display panel 3 by a hinge 4. For the sake of explanation, the part of the electronic apparatus 1 close to the user is designated a front side; the left side of the user is designated left; and the right side of the user is designated right. Up and down are also designated based on the direction of gravity.

The outer shell of the main body 2 is formed from an casing 20. A substrate 5, a cooler 7, an acoustic device, a large-capacity storage device, and a communications module are housed in the main body 2. The casing 20 includes an upper casing 21 which comes to the top when the casing 20 is set on a table, and a lower casing 22 which comes to the bottom. A keyboard 6 serving as input unit is placed on top of the upper casing 21.

As shown in FIG. 1, a semiconductor element 51 is mounted on the substrate 5. The semiconductor element 51 is a CPU (Central Processing Unit), an MPU (Micro-Processing Unit), a GPU (Graphics Processing Unit), or the like, and is an exemplary electronic component that generates heat for reasons of resistance of an internal circuit during operation such as arithmetic operation.

The semiconductor element 51 is provided with the cooler 7. The cooler 7 has a heat receiver 71, a heat pipe 72, a heat-radiating fin 73, and a fastener 74. The heat receiver 71 is brought into intimate contact with the semiconductor element 51 by the fastener 74 fixed to the substrate 5. The heat-receiving end of the heat pipe 72 is fixed to the heat receiver 71. The heat-radiating fin 73 is attached to the heat-radiating end of the heat pipe 72.

The display panel 3 is capable of rotating from a closed state where the display panel 3 overlaps the main body 2, by the hinge 4, to an open state where the display panel 3 stands upright with respect to the main body 2 as shown in FIG. 1. The display panel 3 has a built-in display device 30, and orients a display surface 31 toward the user in the open state. The hinge 4 has rotational resistance which enables retention of the display panel 3 at an arbitrary angle with respect to the main body 2.

The electronic apparatus 1 additionally has a recess portion 23, an air vent 24, a hood 11, an exhaust port 12, a fan 13, a motor 14, and an inlet port 25. In FIG. 1, the keyboard 6, the upper casing 21, and the lower casing 22 are partially cut out to thus make the substrate 5, the cooler 7, the recess portion 23, the fan 13, the air vent 24, and the air intake port 25 visible.

Figure 2:
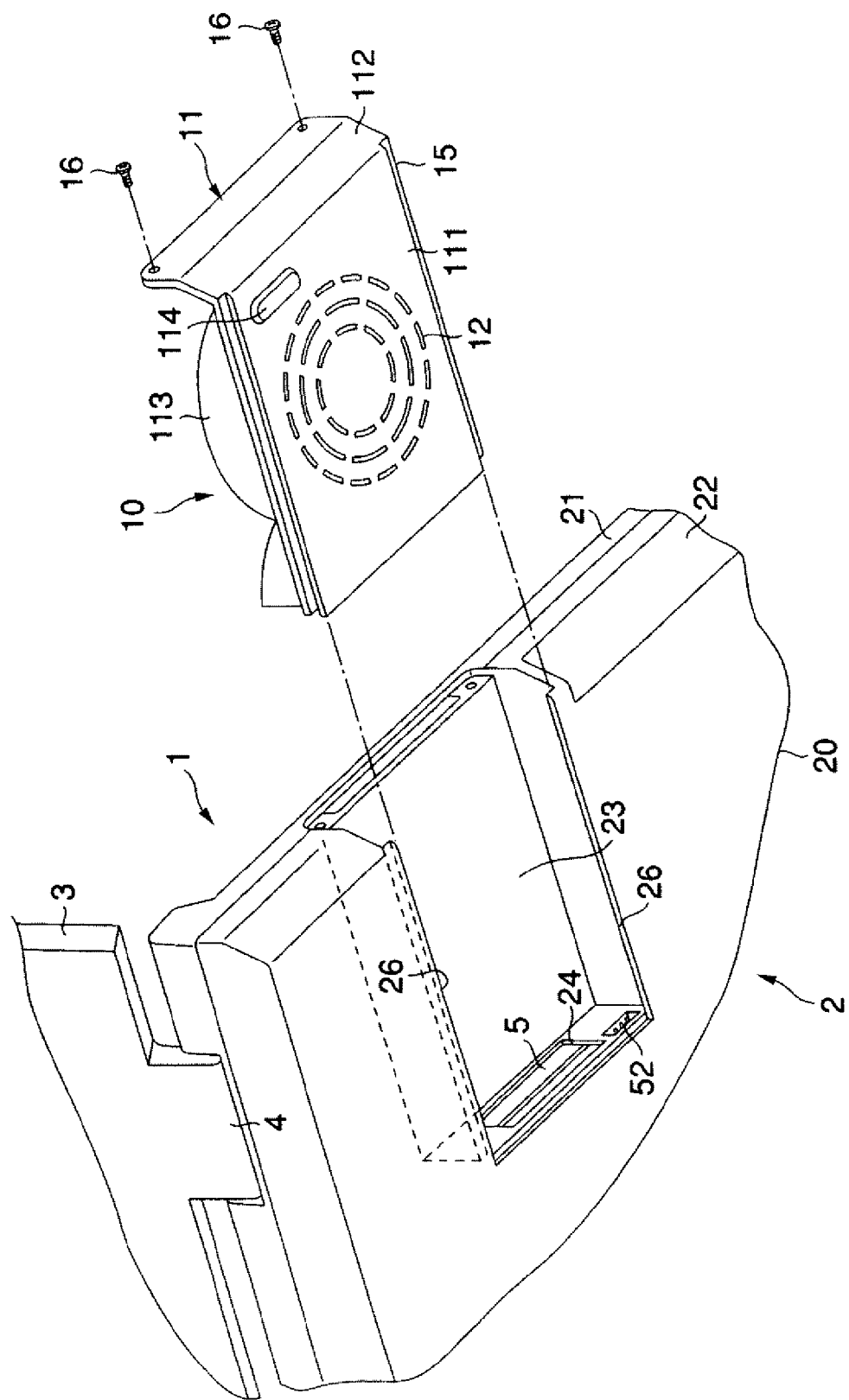
FIG. 2 is an exemplary exploded perspective view of a removed fan module, which is to be built in the electronic apparatus shown in FIG. 1, when viewed from below.
Figure 4:
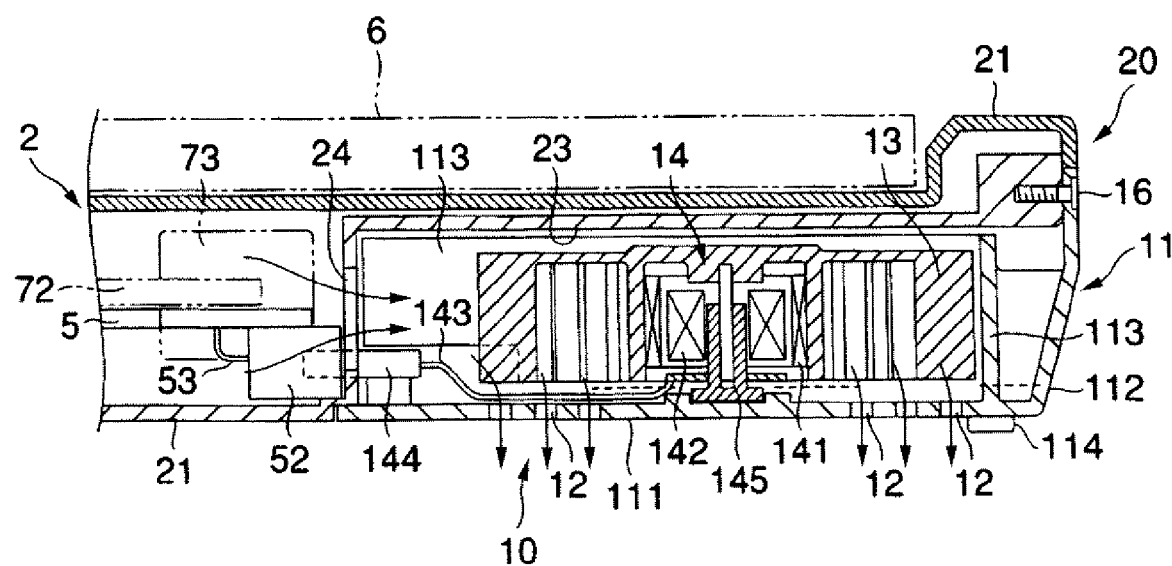
FIG. 4 is an exemplary cross-sectional view of the fan module of the electronic apparatus shown in FIG. 1.

As shown in FIG. 2, the recess portion 23 is provided along an outer rim of the lower casing 22 that becomes the lower surface of the casing 20. The inside of the casing 20 is communicated with the recess portion 23 through the air vent 24; namely, an innermost position when viewed from the left side of the casing 20 in the present embodiment. As shown in FIG. 2, the air vent 24 has a rectangular shape. As shown in FIG. 4, the recess portion 23 is communicated with both upper and lower inner areas of the casing 20 partitioned by the substrate 5 through the air vent 24.

A socket 52 is provided adjacent to the air vent 24. The socket 52 is connected to the substrate 5 by a lead wire 53, and is supplied with power. A guide 26 extending in a direction in which the socket 52 is to be inserted is provided along an angular edge of the recess portion 23 that runs along the lower surface of the casing.

Figure 3:
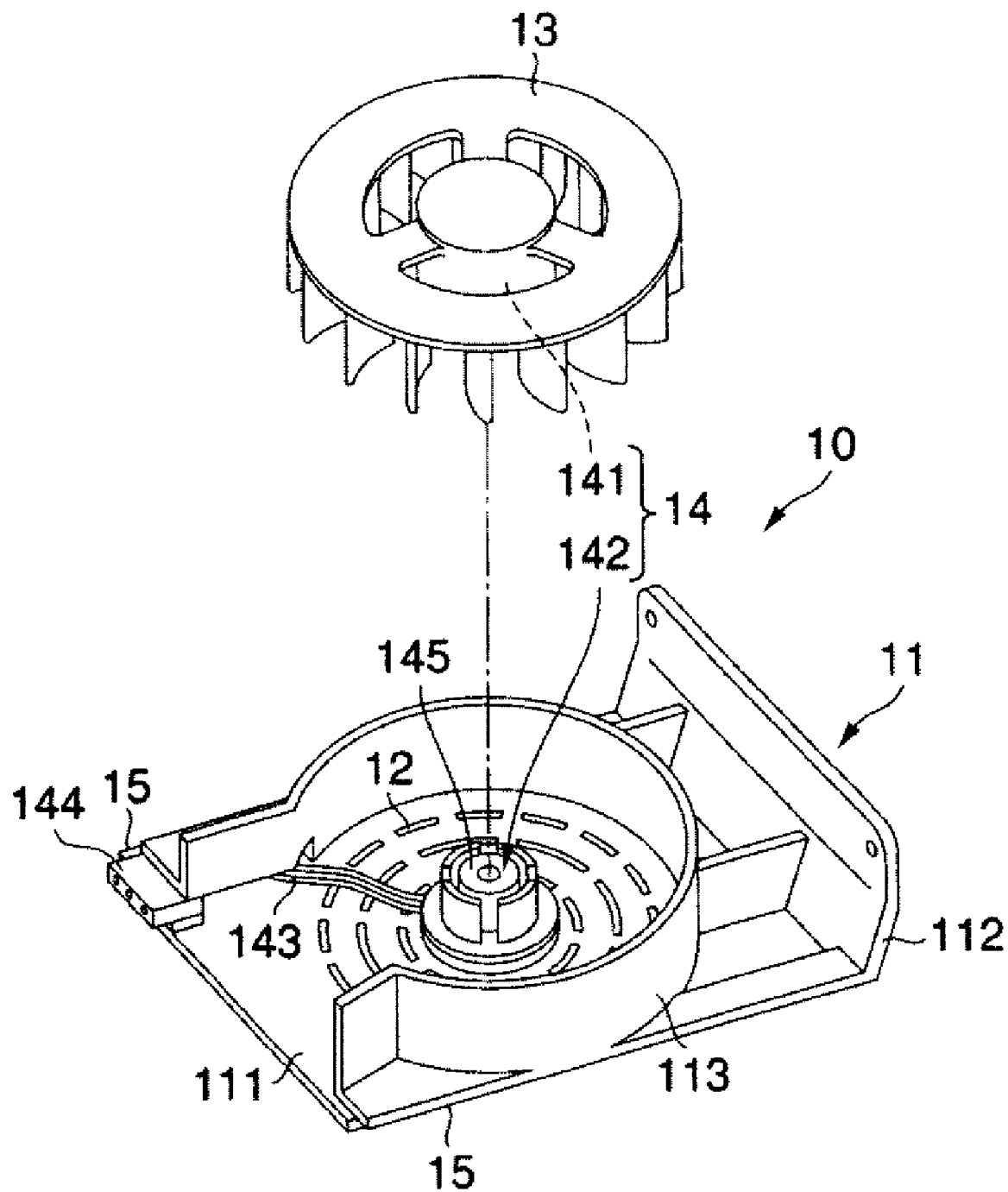
FIG. 3 is an exemplary exploded perspective view of a fan unit shown in FIG. 2.

As shown in FIG. 3, the hood 11 has a bottom wall 111 and a sidewall 112. As shown in FIG. 4, the bottom wall 111 and the sidewall 112 covers the recess portion 23 and the bottom wall 111 and the sidewall 112 are formed so as to form a continuous surface with the casing 20. In the hood 11, the bottom wall 111 has a fitting section 15 which follows the guide 26 formed in the recess portion 23. The hood 11 is inserted along the guide 26 and fastened to the casing 20 with screws 16. The shape and position of the guide 26 and those of the fitting section 15 are not limited to those shown in FIG. 2. Any shape and location may be employed, so long as the guide 26 and the fitting section 15 can guide the hood 11 in the direction where the socket 52 is inserted.

The exhaust port 12 is opened in the bottom wall 111 of the hood 11 in such a way that the recess portion 23 communicates with the outside of the casing 20. The aperture ratio of the exhaust port 12 is determined as appropriate according to the blowing capability of the fan 13. Consequently, the exhaust port 12 is not limited to the shape shown in FIGS. 2 and 3 but may have a lattice shape.

The fan 13 and the motor 14 are housed between the recess portion 23 and the hood 11. The fan 13 is formed integrally with a rotor 141 of the motor 14. A stator 142 of the motor 14 is fixed to a bearing 145 secured to the bottom wall 111 of the hood 11. A permanent magnet is accommodated into the rotor 141, and the stator 142 is provided with an electromagnetic coil. A plug 144 corresponding to the socket 52 is fastened to the end of a lead wire 143 extending from the electromagnetic coil. The fan 13 may be arranged so that a rotation axis of the fan 13 is orthogonal to the substrate 5.

The plug 144 is fixed to the hood 11 in correspondence to the socket 52 placed in the recess portion 23. A fan module 10 formed by mounting the fan 13 and the motor 14 in the hood 11 is inserted along the guide 26, whereupon the plug 144 is inserted into the socket 52. Consequently, the motor 14 is supplied with power from the substrate through the lead wire 53, the socket 52, the plug 144, and the lead wire 143.

The fan 13 takes air in toward the center of the fan 13 and blows out the air in the direction of the rotary shaft by rotation. The fan 13 is not limited to the shape shown in FIG. 3, and vanes of the fan 13 may spread radially or have the shape of a propeller. As shown in FIG. 4, a fan casing 113 surrounding the outer periphery of the fan 13 exclusive of its face opposing the air vent 24 stands upright from the bottom wall 111 of the hood 11 to the recess portion 23 by a very slim margin. The air vent 12 is provided within the space surrounded by the fan casing 113.

The fan 13 is surrounded by the fan casing 113. As shown in FIG. 4, the fan 13 rotates to thus suction out the internal air of the casing 20 to the recess portion 23 through the air vent 24, and further blows the air to the outside of the casing 20 through the exhaust port 12. In the embodiment, as shown in FIGS. 1 and 4, a heat-radiating end of a heat pipe 72 of the cooler 7 is placed in the casing 20 which comes to the upstream of the air vent 24.

The casing 20 has the air intake ports 25 provided at positions away from the air vent 24. In FIG. 1, the air intake port 25 is formed in the right sidewall of the lower casing 22, and the other air intake port 25 is formed in a lower wall at a right front side of the lower casing 22. As a result of the fan 13 being driven, warm air in the casing 20 is suctioned out through the air vent 24, and outside air is taken into the casing 20 through the air intake ports 25. Since the air intake ports 25 are located at positions away from the air vent 24, the internal air of the casing 20 is efficiently ventilated.

In order to prevent the exhaust port 12 from being blocked, a leg 114 is attached to the exterior surface of the bottom wall 111 at a position adjacent to the exhaust port 12. When a main leg supporting the main body 2 is attached to the lower surface of the lower casing 22 close to the recess portion 23 and the exhaust port 12 is supported in a suspended state at all times in the case where the electronic apparatus 1 is placed on a flat surface, there is no necessity for attaching the leg 114 to the bottom wall 111.

According to the above configuration, the electronic apparatus 1 has the recess portion 23 formed on the lower casing 22 constituting the casing 20, and the fan 13 and the motor 14 are placed between the recess portion 23 and the hood 11 covering the recess portion 23. Specifically, the housing enclosing the fan 13 includes the lower casing 22 and the hood. The heat of the air suctioned out from the inside of the casing 20 by the fan 13 is transmitted to the hood 11 and the lower casing 22, which form the housing of the fan 13, as well. The exterior surface of the hood 11 opposite to the fan 13 remains in direct contact with the outside air, and hence the heat of the air suctioned out from the casing 20 by the fan 13 is also discharged into the outside through the hood 11. The heat transmitted to the recess portion 23 of the lower casing 22 is transferred to a place where the heat contacts the outside air by way of the lower casing 22.

As mentioned above, since the fan 13 is interposed between the recess portion 23 and the hood 11, the internal heat of the casing can be efficiently discharged. Further, the fan module 10 accommodated with the fan 13 and the motor 14 in the hood 11 can be readily removed without disassembling the casing 20 from the outside. Consequently, according to the quantity of internal heat in the casing 20, the fan module 10 can be readily replaced with a fan module exhibiting a large flow rate, as appropriate, for instance, when a semiconductor element that generates a large quantity of heat is mounted on the substrate.

Figure 5:
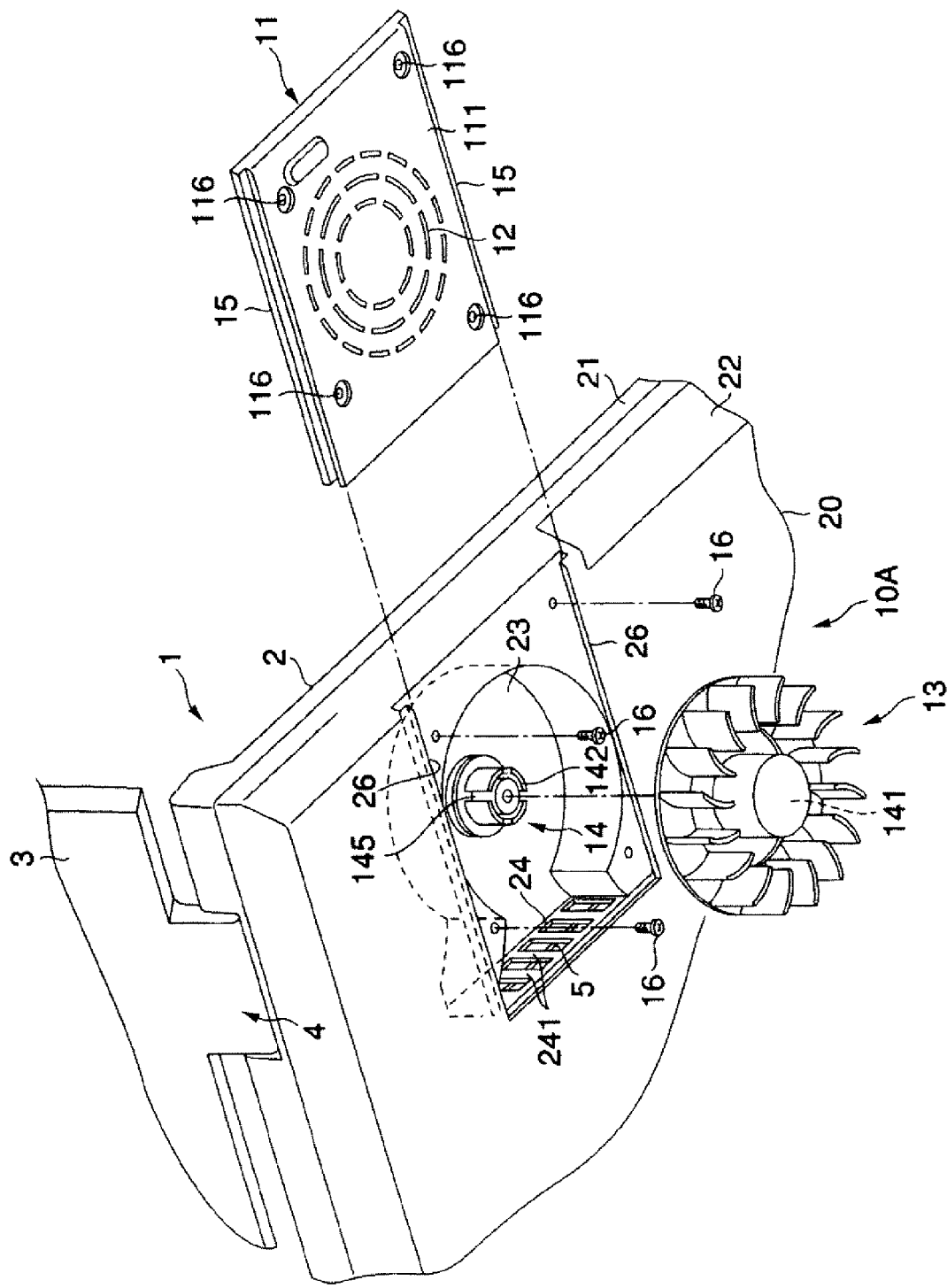
FIG. 5 is an exemplary exploded perspective view of a fan module of electronic apparatus according to a second embodiment of the present invention acquired when viewed from below.
Figure 6:
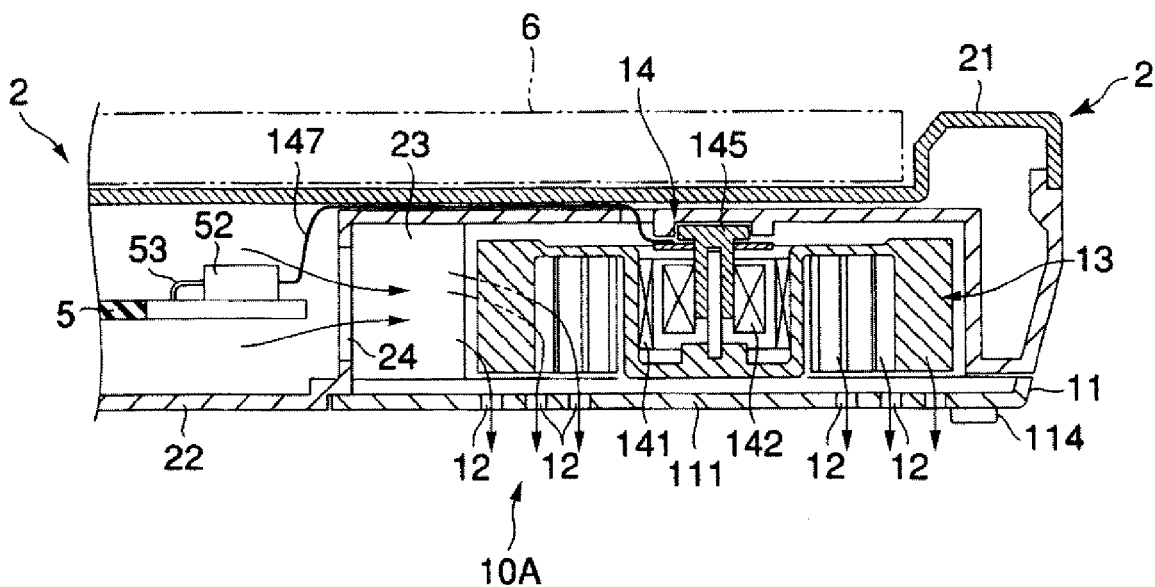
FIG. 6 is an exemplary cross-sectional view of the fan module of the electronic apparatus shown in FIG. 5.

The electronic apparatus 1 according to a second embodiment of the present invention will be described with reference to FIGS. 5 and 6. Elements and configuration having the same functions as those of the electronic apparatus 1 according to the first embodiment are assigned the same reference numerals, and their repeated explanations are omitted. A fan module 10A shown in FIG. 5 is assembled integrally with the lower casing 22.

The recess portion 23 formed in the lower casing 22 also serves as the fan casing 113 of the first embodiment. The bearing 145 supporting the stator 142 of the motor 14 is fixed by the recess portion 23. Consequently, the fan 13 is supported by the recess portion 23 to which the bearing 145 is secured. The hood 11 is inserted from the left side of the casing 20 along the guide 26 and fixed from below with the screws 16.

The air vent 24 is partitioned into a plurality of segments by bridges 241 extending in the normal direction. Power to the motor 14 is supplied through a flexible wire 147. As shown in FIG. 6, a flexible wire 147 runs from the substrate 5 to the vicinity of the stator 142 in the casing 20, and is routed to the recess portion 23 through a hole formed in the lower casing 22.

According to the above configuration, the electronic apparatus 1 has the casing of the fan 13 integrally attached to the casing 20. The hood 11 faces outside, and the recess portion 23 is formed along with the lower casing 22 without any discontinuity. The heat, which has been transferred from the air suctioned out from the inside of the casing 20 by the fan 13 to the hood 11 and the recess portion 23, is easily discharged. Further, in this electronic apparatus 1, the recess portion 23 is formed on the lower casing 22 so as to serve also as a fan casing. Hence, the space around the fan module 10a can be effectively utilized.

Figure 7:
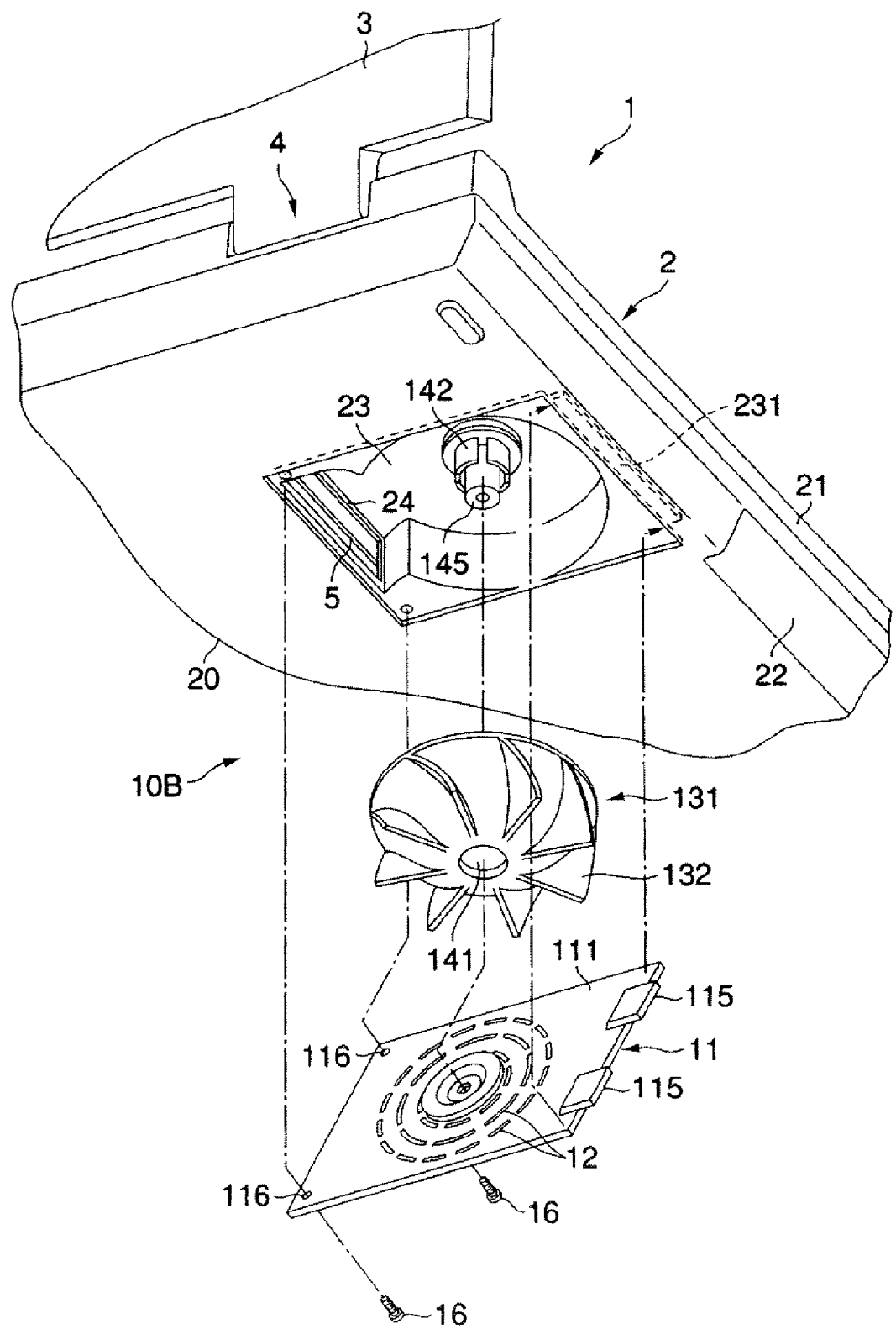
FIG. 7 is an exemplary exploded perspective view of a fan module of electronic apparatus according to a third embodiment of the present invention acquired when viewed from below.

The electronic apparatus 1 according to a third embodiment of the present invention will be described with reference to FIGS. 7 and 8. Elements and configurations having the same functions as those of the electronic apparatus 1 described in the first and second embodiments are assigned the same reference numerals, and their repeated explanations are omitted. A fan module 10B shown in FIG. 7 is integrally assembled with the lower casing 22 as in the case of the second embodiment.

The bearing 145 supporting the stator 142 of the motor 14 is secured to the recess portion 23. As shown in FIG. 8, a fan 131 has a shape wherein vanes 132 are obliquely attached to a mountain-shaped slope. The hood 11 is fixed to the lower casing 22 by latching a claw 115 provided on one side of the hood 11 to an engagement section 231 provided along the rim of the recess portion 23 and attaching the screws 16 to a fixing hole 116 formed at a corner opposite to the claw 115.

Figure 8:
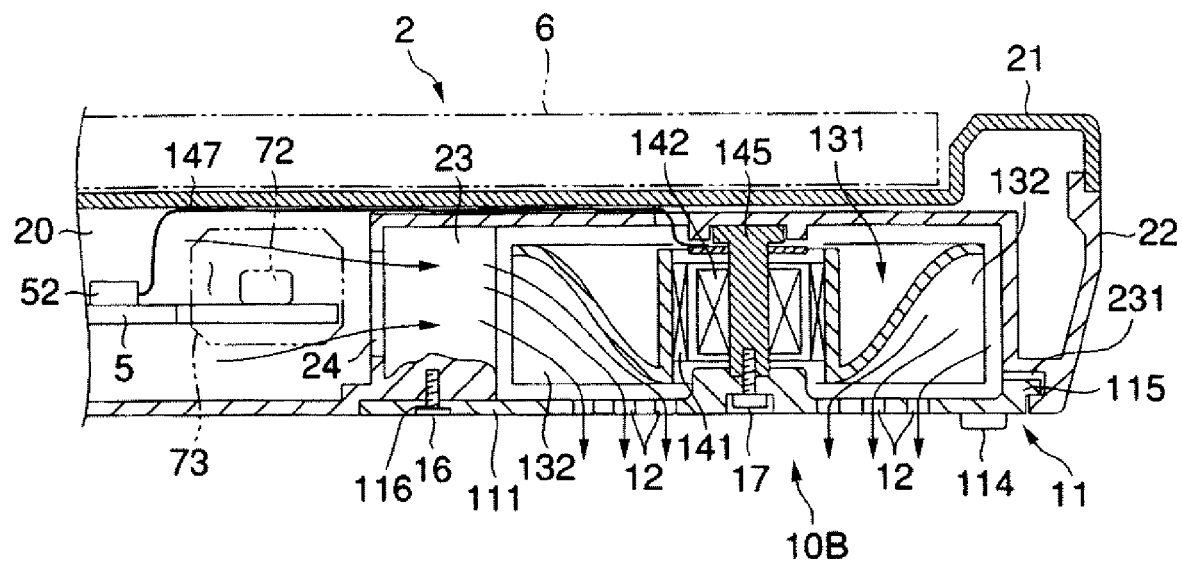
FIG. 8 is an exemplary cross-sectional view of the fan module of the electronic apparatus shown in FIG. 7.

As shown in FIG. 8, the bearing 145 to which the stator 142 is secured contacts the hood 11, and the center of the bearing 145 is fixed with a screw 17. Since both ends of the center shaft of the fan 131 are supported, rotation of the fan 13 becomes stable. The fan 131 is not limited to the shape shown in FIGS. 7 and 8 but may also have a shape described in connection with the second embodiment. Specifically, the shape shows that the hood 11 is attached to the lower surface of the main body. The appearance of the main body 2 viewed from the side is enhanced.

As in the case of the fan module 10B of the present embodiment, the hood 11 is attached to the casing 20 from below. As a result, the possibility of providing the fan not along the outer periphery of the casing 20 but according to the layout of electronic components mounted on the substrate 5 can also be considered.

Figure 9:
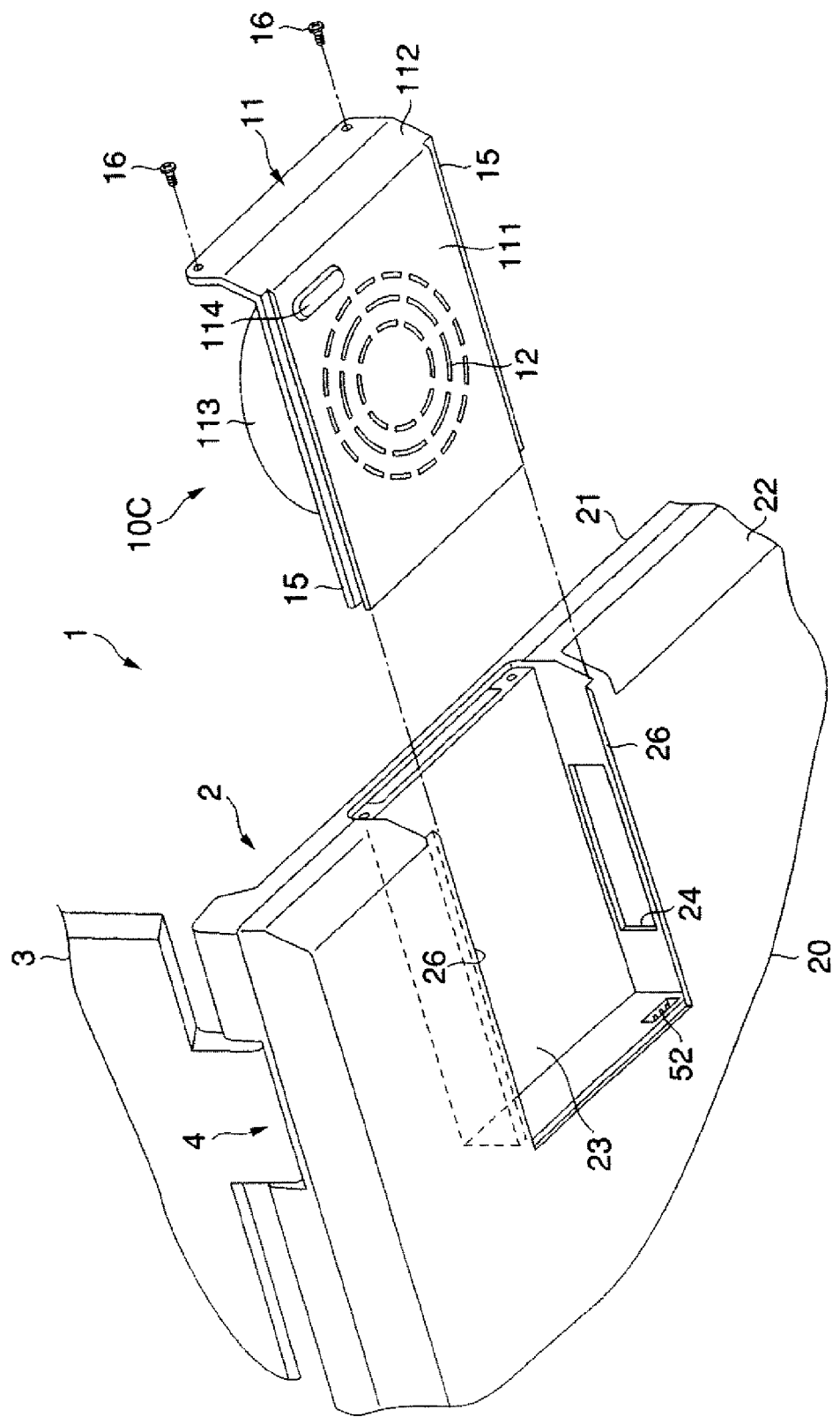
FIG. 9 is an exemplary exploded perspective view of a removed fan module of electronic apparatus according to a fourth embodiment of the present invention acquired when viewed from below.

Electronic apparatus according to a fourth embodiment of the present invention will be described with reference to FIG. 9. Elements and configurations having the same functions as those of the electronic apparatus 1 described in the first through third embodiments are assigned the same reference numerals, and their repeated explanations are omitted. A fan module 10C shown in FIG. 9 is almost same as the fan module 10 of the first embodiment.

The air vent 24 opened in the recess portion 23 is provided in the sidewall along the direction in which the socket 52 is inserted. The air vent 24 is formed on a sidewall different from a position where the socket 52 is formed, whereby the area of the opening can be broadened. Consequently, a fan of large displacement can be provided. The fan casing 113 provided on the hood 11 is formed so as to become opened toward the air vent 24.

In the electronic apparatus 1 according to the first through fourth embodiments, the fan 13 radially takes air in and suctions the air out in the direction of the rotary shaft. Consequently, the air vent 24 may be provided all over the circumference of the fan 13. In this case, the fan casing 113 of the first through fourth embodiments may be not necessary, or an opening may be provided in this area.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all the components disclosed in the embodiments. Further, components in different embodiments may be appropriately combined.

What is claimed is:

1. An electronic apparatus comprising:
    a substrate on which an electronic component is mounted;
    a casing that accommodates the substrate and has a recess portion;
    an air vent through which the recess portion is communicated with an inside of the casing;
    a hood that covers the recess portion and includes an exhaust port;
    a fan that is configured to suction air from the inside of the casing through the air vent to the recess portion and discharge the air to outside through the exhaust port, the fan being (i) housed between the recess portion and the hood and (ii) rotatable supported by the recess portion; and
    a motor that is supplied with power from the substrate to rotate the fan, the motor being housed between the recess portion and the hood.

2. The electronic apparatus according to claim 1, wherein the fan is arranged so that a rotation axis of the fan is orthogonal to the substrate.

3. The electronic apparatus according to claim 1, wherein the motor is fixed to the recess portion.

4. The electronic apparatus according to claim 1, wherein the motor is fixed to the hood.

5. The electronic apparatus according to claim 4, wherein the recess portion includes a socket that is connected to the substrate and supplies the power to the motor,
    wherein the hood includes a plug connected to the motor, and
    wherein the plug fits to the socket when the hood is attached to the recess portion.

6. The electronic apparatus according to claim 1, wherein the exhaust port is disposed at a lower side of the casing, when the hood is attached to the recess portion; and
    wherein the hood includes a leg that when the casing is set on a flat surface, keeps the exhaust port separate from the flat surface.

7. The electronic apparatus according to claim 5, wherein the recess portion has a guide extending in a direction to which the socket is inserted, and wherein the hood includes an engagement portion engageable along the guide.

8. The electronic apparatus according to claim 1, wherein the casing includes an air intake port at a position apart from the air vent.

9. An electronic apparatus comprising:

a substrate on which an electronic component is mounted;

a casing that accommodates the substrate and includes a recess portion;

an air vent connecting the recess portion to an inside of the casing;

a hood that covers the recess portion and includes an exhaust port;

a fan that is configured to suction air from the inside of the casing through the air vent to the recess portion and discharge the air through the exhaust port, the fan being housed between the recess portion and the hood; and a motor that is supplied with power from the substrate to rotate the fan, the motor being housed between the recess portion and the hood and fixed to the recess portion.

10. The electronic apparatus according to claim 9, wherein the fan is arranged so that a rotation axis of the fan is orthogonal to the substrate.

11. The electronic apparatus according to claim 9, wherein the fan is rotatably supported by the recess portion.

12. The electronic apparatus according to claim 9, wherein the exhaust port is disposed at a lower side of the casing, when the hood is attached to the recess portion.

13. The electronic apparatus according to claim 12, wherein the hood includes a leg that when the casing is set on a flat surface, keeps the exhaust port separate from the flat surface.

14. The electronic apparatus according to claim 9, wherein the casing includes an air intake port at a position apart from the air vent.

* * * * *